(12) United States Patent  
Wieland et al.

(10) Patent No.: US 7,084,414 B2  
(45) Date of Patent: Aug. 1, 2006

(54) CHARGED PARTICLE BEAMLET EXPOSURE SYSTEM

(75) Inventors: Marco Jan-Jaco Wieland, Delft (NL); Pieter Kruit, Delft (NL)

(73) Assignee: Mapper Lithography IP B.V., Ch Delft (NL)

( * ) Notice: Subject to any disclaimer, the term of this patent is extended or adjusted under 35 U.S.C. 154(b) by 148 days.

(21) Appl. No.: 10/856,050

(22) Filed: May 27, 2004

(65) Prior Publication Data

US 2005/0161621 A1  Jul. 28, 2005

Related U.S. Application Data

(60) Provisional application No. 60/473,810, filed on May 28, 2003.

(51) Int. Cl.
*H01J 37/04* (2006.01)
*H01J 37/10* (2006.01)

(52) U.S. Cl. ............ 250/492.23; 250/492.22; 250/492.1; 250/492.3

(58) Field of Classification Search ............ None
See application file for complete search history.

(56) References Cited

U.S. PATENT DOCUMENTS

| 4,243,866 A | 1/1981 | Pfeiffer et al. |
| 4,543,512 A | 9/1985 | Nakasuji |
| 4,544,847 A | 10/1985 | Taylor |
| 5,912,469 A * | 6/1999 | Okino ............ 250/492.23 |
| 6,014,200 A | 1/2000 | Sogard et al. |
| 2002/0039829 A1 | 4/2002 | Yasuda |

\* cited by examiner

*Primary Examiner*—Nikita Wells
(74) *Attorney, Agent, or Firm*—Blakely Sokoloff Taylor & Zafman

(57) ABSTRACT

The invention relates to a charged-particle-optical system for a charged particle beam exposure apparatus, said system comprising:
  a first aperture means comprising at least a first substantially round aperture for partially shielding an emitted charged particle beam for forming a charged particle beamlet;
  a lens system comprising at least one lens for focussing a charged particle beamlet from said first aperture within or in the vicinity of an image focal plane of said lens;
  a deflector means, substantially located in said image focal plane, comprising at least one beamlet deflector for the deflection of a passing charged particle beamlet upon the reception of a control signal, and
  a second aperture means comprising at least one second substantially round aperture positioned in the conjugate plane of the first aperture, and said second aperture being aligned with said first aperture and said beamlet deflector for blocking said charged particle beamlet upon deflection by said beamlet deflector and to transmit it otherwise.

23 Claims, 14 Drawing Sheets

CHARGED PARTICLE BEAMLET EXPOSURE SYSTEM

Figures 1, 1A:
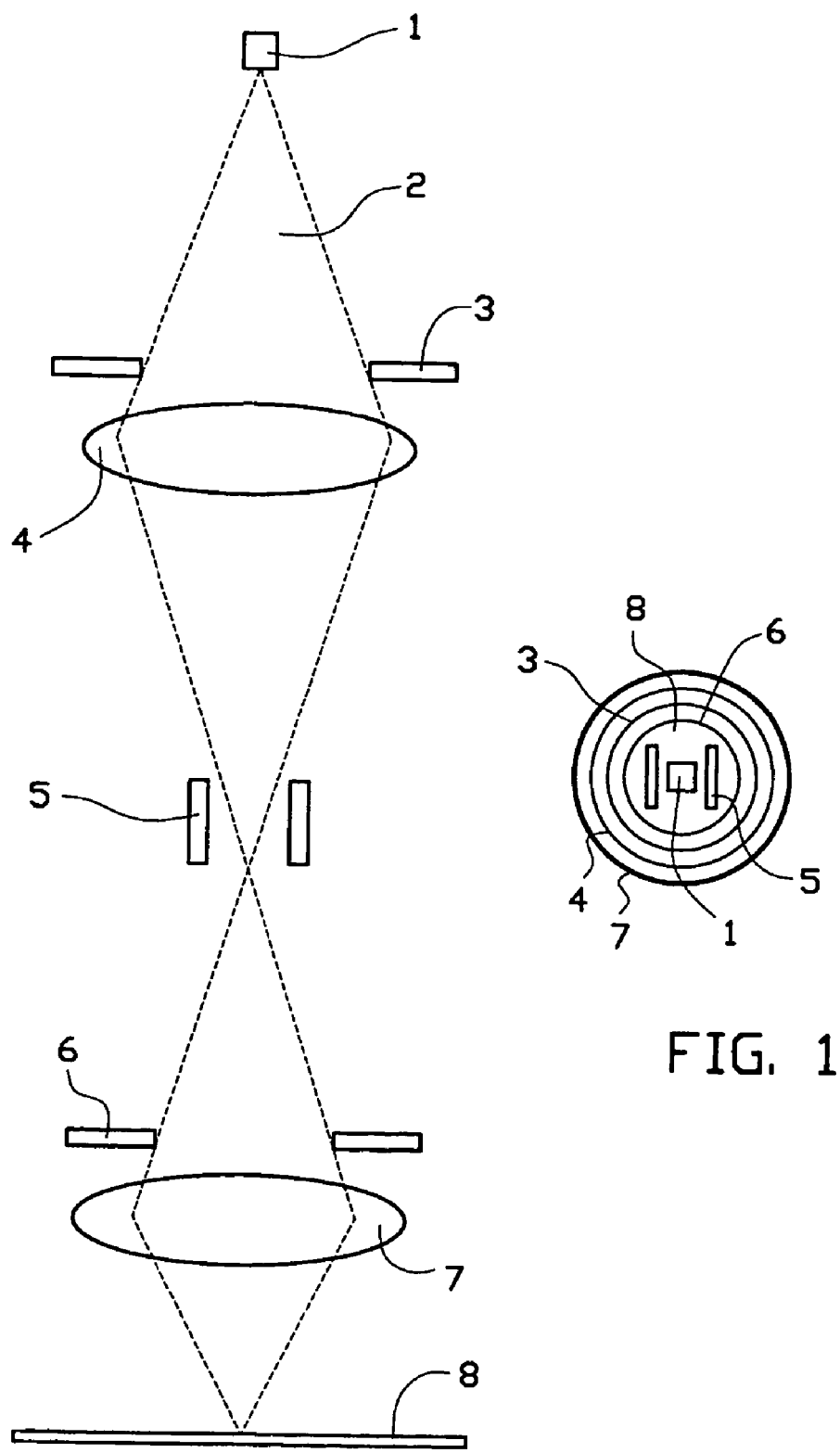

This application claims the benefit of U.S. Provisional Application No. 60/473,810, filed May 28, 2003.

BACKGROUND

This invention relates to charged particle optical system for a charged particle exposure apparatus, in particular a maskless lithography system using charged particles.

The development of lithography systems in particular is driven by Moore's law i.e. the number of transistors per unit area doubles every 18 months. Consequently the feature sizes decrease rapidly resulting in a sharp increase of the costs of a masks currently used for providing a pattern. To avoid the increasing mask costs several maskless lithography concepts are under development. In these concepts the pattern is represented by pattern data. Since a mask is a highly efficient way to store a pattern, the amount of raw data describing such a pattern is enormous.

Current maskless lithography systems are limited in throughput, i.e. the number of processed wafers per hour. This feature limits the use of these systems in present day semiconductor element processing lines. The throughput of a maskless lithography system can be enhanced by using a plurality of beamlets and/or by increasing the data rate.

The supply of data can be increased in two ways. A first way of increasing the data rate is by sending the pattern data directly to the beam source or sources, thus switching the source of sources on and off. Alternatively, the source or sources continuously emit one or more beamlets and the pattern data is provided to modulation means that modulate the emitted beamlets along their pathway towards the target to be patterned.

The data supply to the sources becomes a problem when the data rate increases: Each individual source has a settling time that is source-dependent and becomes too large easily. It is therefore preferred to modulate the beamlets along their optical pathway.

In charged particle beam lithography systems, these modulation means are often electrostatic deflection arrays, also known as blanking aperture arrays (BAA) or deflection arrays. Examples of such arrays are disclosed in U.S. Pat. No. 6,188,074 by Advantest and in EP-patent application 1253619 by Canon. Upon the supply of an electric signal towards a certain deflection element, an electric field is established over a corresponding aperture, which results in the deflection of a charged particle beam passing through the aperture. By positioning an aperture plate behind the deflection array, wherein the apertures are aligned with apertures in the deflection array, the deflected beams are blocked and therefore do not reach the target.

Before the charged particles reach the deflection array, the beams most often pass an aperture array. This aperture array has several functions. In lithography systems comprising a single source it is used to split an emitted beam in a plurality of beamlets. Furthermore, it determines the opening angle of the beam at the deflection array. Additionally the aperture array reduces the heat load on the deflection array, thereby enhancing its performance.

Especially in compact multibeam designs, misalignment of the consecutive components (lenses, apertures etc.) of the system or a slight change of the position of the beam by for instance external electromagnetic fields, for instance resulting from charging of surfaces or irregularities on charged surfaces, results in dose variations. As a result of the dose variation the control of the critical dimensions of the features to be patterned is no longer guaranteed. One way of dealing with misalignment problems is increasing the opening angle of each beamlet, i.e. making the cross section of a beamlet on an aperture array larger than the aperture which is passes. In that way, it is ensured that the entire area of an aperture is illuminated.

This approach has several drawbacks, which become pertinent when high speed and extreme dose stability are required. The relatively large cross section will increase the heat load on an aperture array. Furthermore, the amount of deflection needed to completely block a beamlet will increase (see drawings for an explanation), which will reduce the speed and thus throughput of such a system. Also, for accurate dose control at the position of a substrate it is desired to approach a tophat distribution of the beam intensity as much as possible. A large opening angle of a beam causes a beam to have large tails.

SUMMARY OF THE INVENTION

It is the purpose of the present device to provide a maskless charged particle lithography system with arrangements to overcome the aforementioned problems encountered in charged particle optical systems, in particular is such systems used in the present maskless charged particle beam lithography systems, both single and multi-beam. It thus seeks to provide a charged particle optical system which has an improved speed and stability.

The invention therefore provides a charged-particle-optical system for a charged particle beam exposure apparatus, said system comprising:

a first aperture means comprising at least a first substantially round aperture for partially shielding an emitted charged particle beam for forming at least one charged particle beamlet;

a lens system comprising at least one lens for focussing said charged particle beamlet or beamlets, originating or arriving from said first aperture, within or in the vicinity of an image focal plane of said lens;

a deflector means, substantially located in said image focal plane, comprising at least one beamlet deflector for the deflection of said charged particle beamlet or beamlets when passing said deflector upon the reception of a control signal, and a second aperture means comprising at least one second substantially round aperture positioned in the conjugate plane of the first aperture, and said second aperture being aligned with said first aperture and said beamlet deflector for blocking said charged particle beamlet or beamlets upon deflection by said beamlet deflector and to transmit it otherwise.

It was found that imaging a previous aperture or aperture array on a subsequent aperture or aperture array makes the system more stable with respect to alignment, and reduces heat load by shielding or blocking.

In this respect, with conjugate planes are meant planes formed by a plane on one side of a lens or lens system and its image plane at the other side of the lens or lens system.

In an embodiment, the system relates to a system according to the present invention for a charged particle beam exposure apparatus using a plurality of charged particle beamlets, wherein said first aperture means comprises a plurality of said first apertures forming an aperture array with one aperture for each beamlet, said lens system comprises a plurality of said lenses forming an array of lenses, each lens positioned to focus one of the plurality of charged particle beamlets from said first aperture means, said second aperture means comprises a plurality of said second apertures forming an aperture array, said deflector means comprising a plurality of said beamlet deflectors, each beamlet deflector positioned for the deflection of a passing charged particle beamlet upon receiving a control signal corresponding to the desired pattern to be exposed.

In an embodiment of the system said lens or lenses comprises an electrostatic lens.

In another or further embodiment, said beamlet deflector or beamlet deflectors comprises an electrostatic deflector. In a further embodiment thereof, said electrostatic deflector comprises at least two deflection electrodes.

In an embodiment, the system used in an apparatus using a plurality of beamlets, further comprises a second lens system arranged before said first aperture means and comprising a plurality of lenses forming an array of lenses, said lenses arranged for converging said beamlets.

In a further embodiment thereof, the system further comprises a third lens system arranged before said first aperture means and comprising a plurality of lenses, arranged to project images of a source of a charged particle beam exposure apparatus in the principal plane of said second lens system, the charged particle optical system further comprising a third aperture array wherein the second lens array is arranged to project images of said third aperture array on said first aperture array.

The invention further relates to a charged particle exposure apparatus for exposing a substrate to a plurality of charged particle beamlets, comprising a first aperture array comprising a plurality of first apertures, one aperture for each charged particle beamlet, a lens system comprising a plurality of lenses forming an array of lenses, said lenses aligned with said first apertures, and a second aperture array comprising a plurality of second apertures aligned with said first apertures, wherein said lens system is arranged between said first aperture array and said seconds aperture array for imaging said first aperture array on said second aperture array.

In an embodiment thereof, the apparatus comprises at least one further aperture array and at least one further lens array, wherein between each aperture array a lens array is positioned, arranged for imaging a previous lens array on a subsequent lens array.

The invention further relates to a charged particle exposure apparatus for exposing a substrate to at least one charged particle beamlet, comprising a substantially round first aperture for blocking part of said charged particle beamlet, a lens system comprising at least one lens, said lens system aligned with said first apertures, a substantially round second aperture aligned with said first apertures, and deflection means comprising at least one beamlet deflector for deflecting said beamlet when passing said deflector upon reception of a control signal, said lens system arranged between said first aperture and said second aperture for projecting an image of said first aperture on said second aperture, and said deflector substantially located in an image focal plane of said lens system.

In various contemplated embodiments, this apparatus can have one or more of the features described above or in the description of embodiments below.

The invention further relates to a method of exposing a pattern on a target exposure surface using the system or the apparatus according to the invention.

The invention further relates to a substrate processed with the system or apparatus of the invention.

In an embodiment of the invention, said charged particle beam or charged particle beamlet is an electron beam. In another embodiment, said charged particle beam or charged particle beamlet is an ion beam.

The invention further relates to a charged particle beam lithography system comprising the apparatus of charged particle optical system of the invention described above. The invention further relates to a substrate processed with such a charged particle beam lithography system.

The invention further relates to a charged particle beam microscopy system comprising the apparatus described above.

DRAWINGS

The invention will be further elucidated in the following embodiments of a charged particle optical system, in particular for a maskless lithography system, according to the current invention, in which:

FIG. 1 shows a cross-section of a charged particle optical system according to the invention, FIG. 1A shows a top view of FIG. 1.

Figure 2:
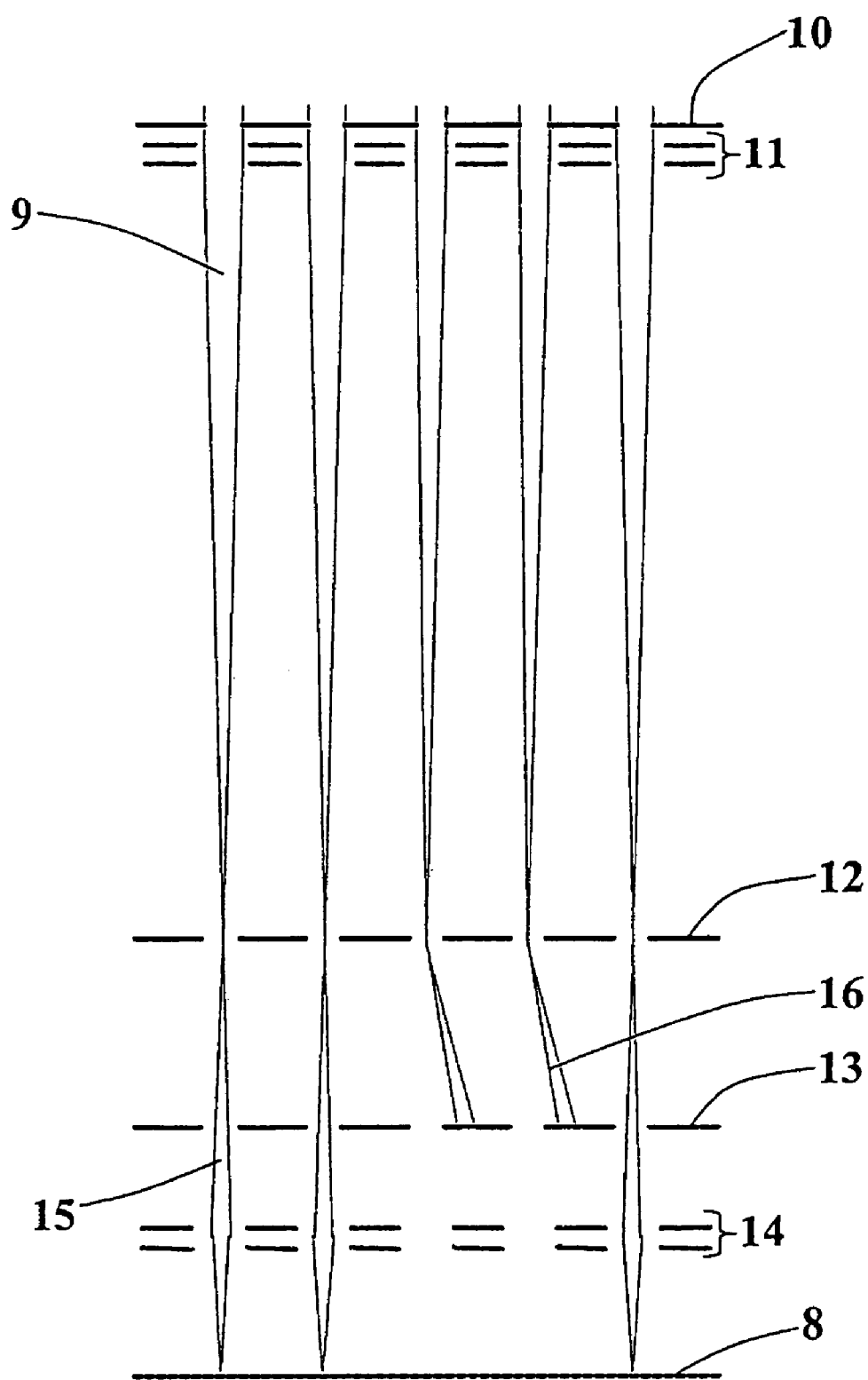
Figure 3A:
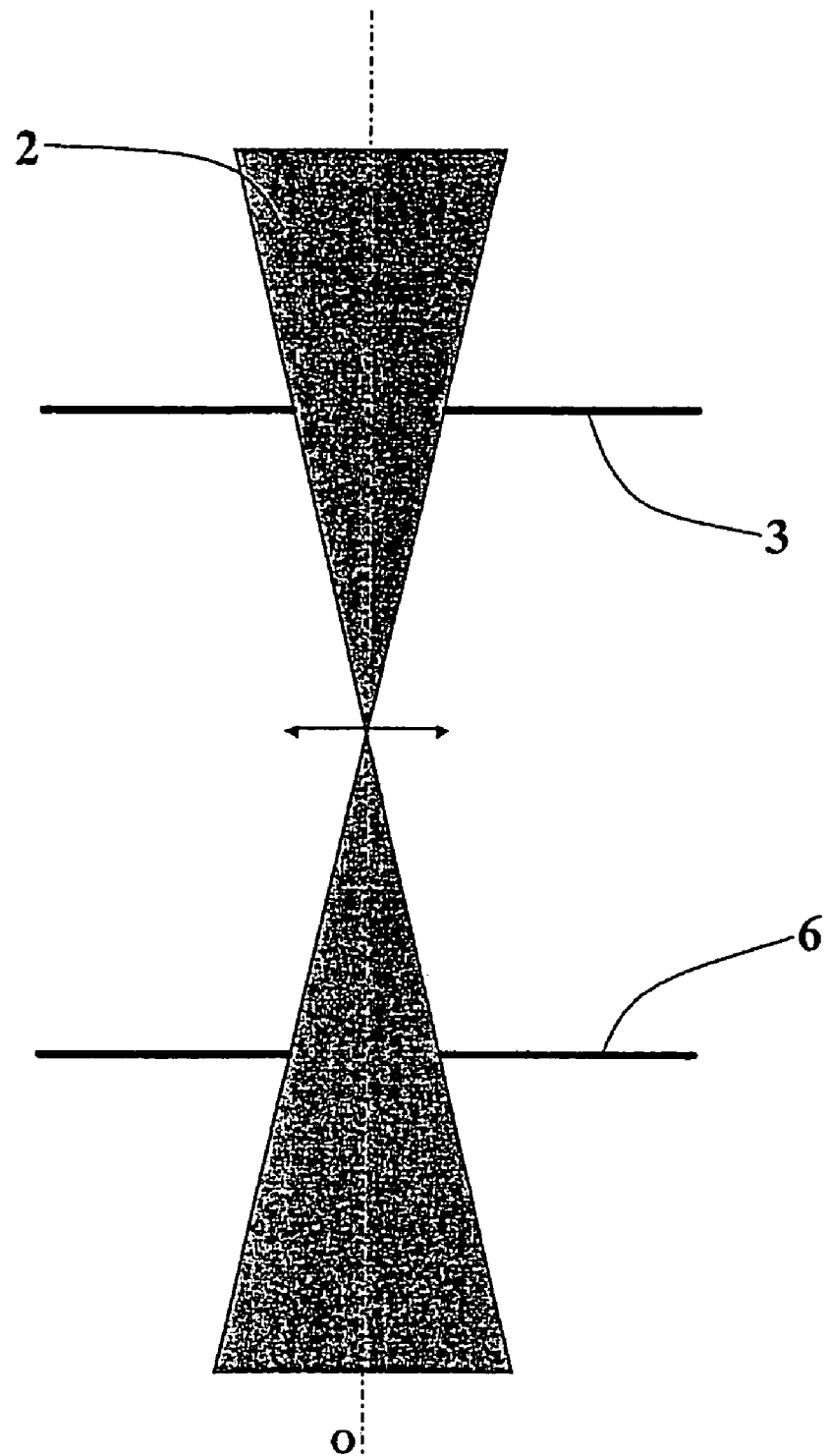
Figure 3B:
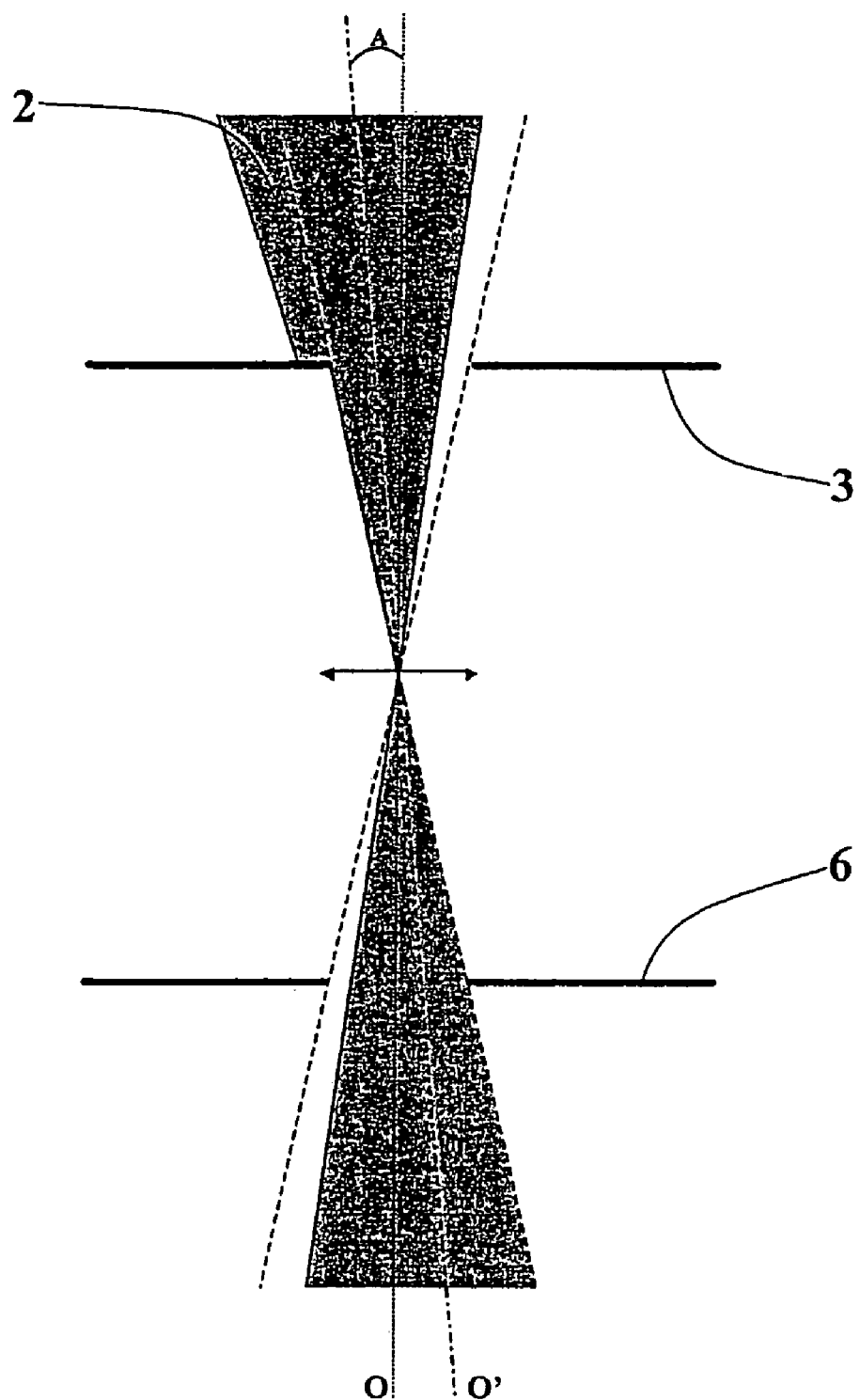
Figure 3C:
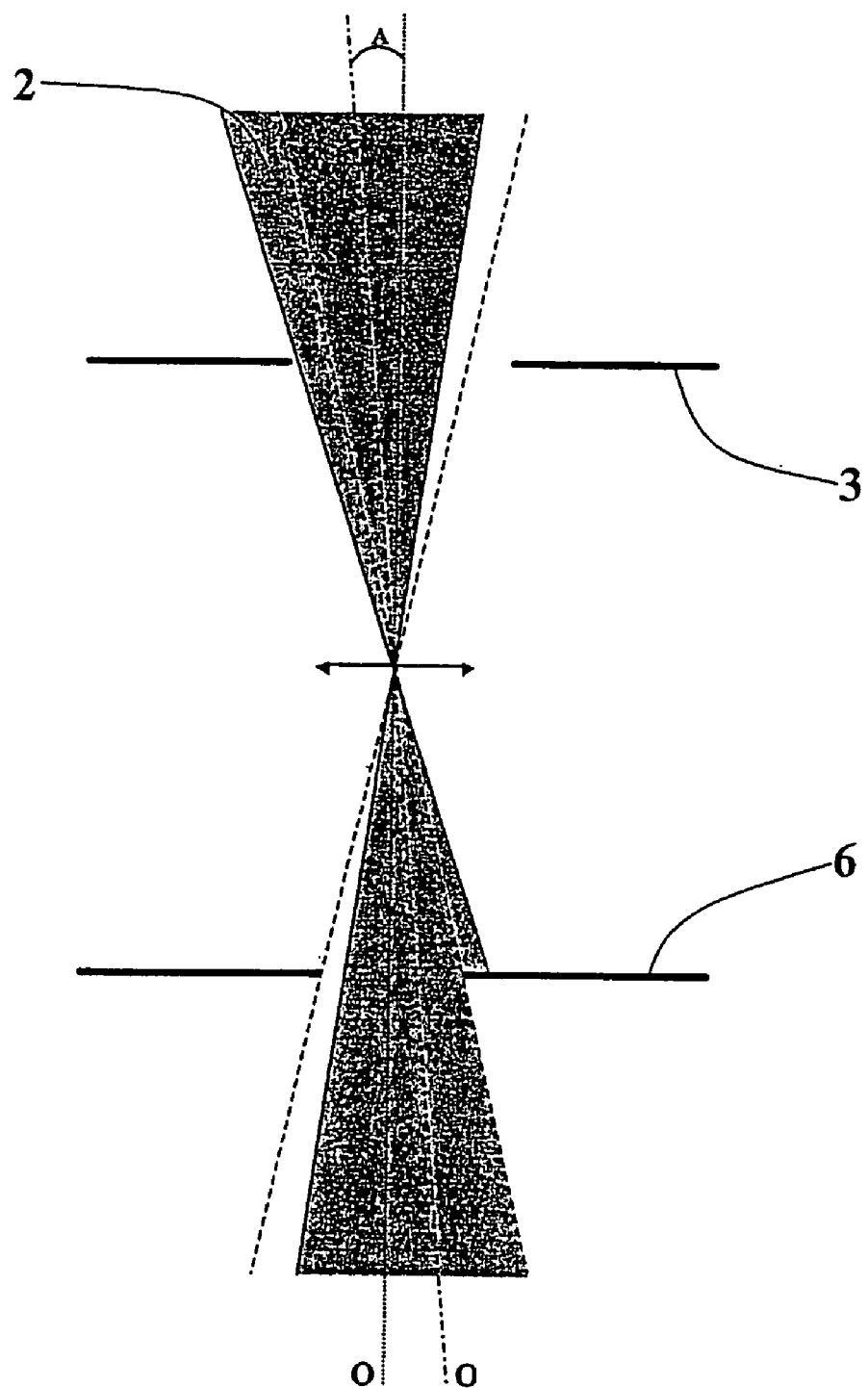
Figure 3D:
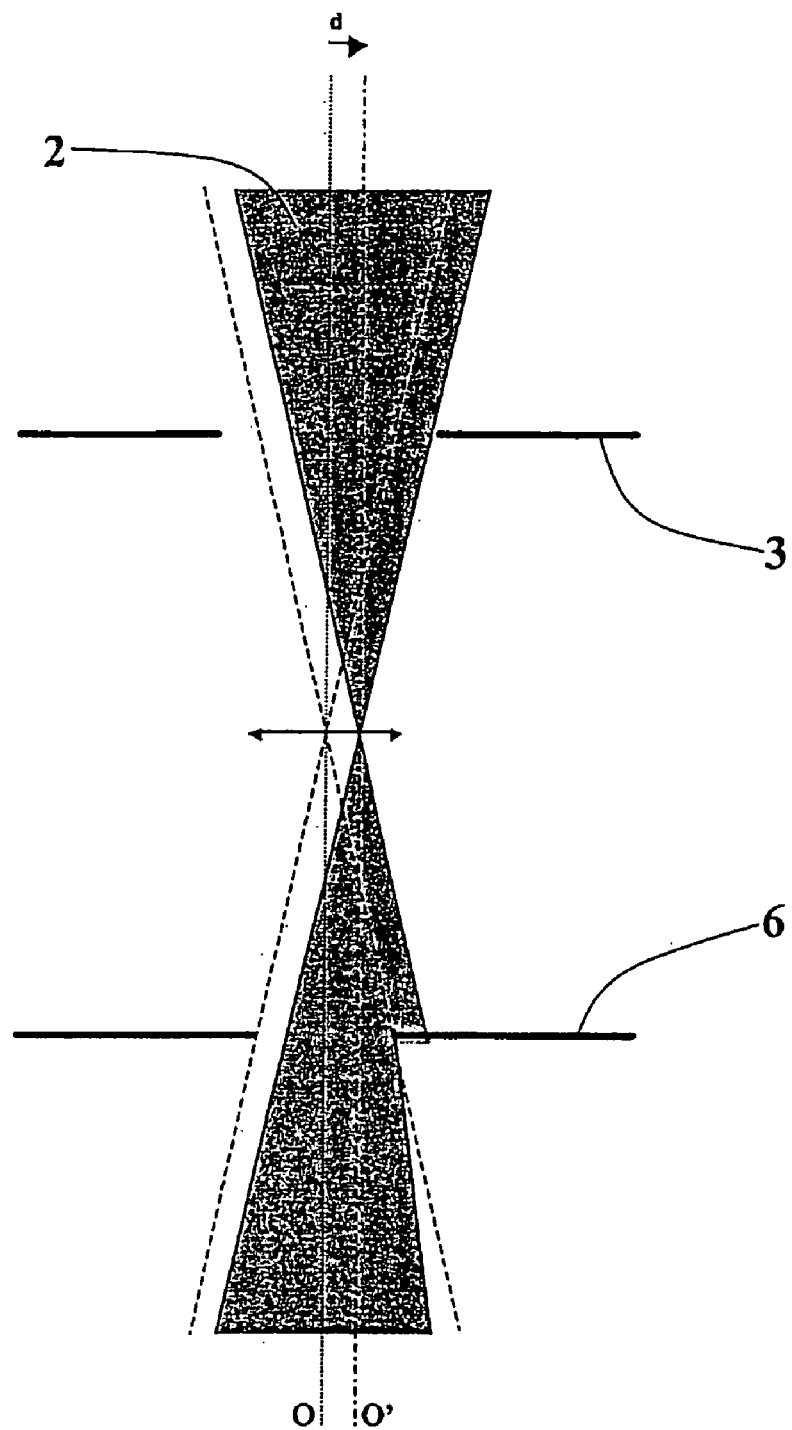
Figure 4A:
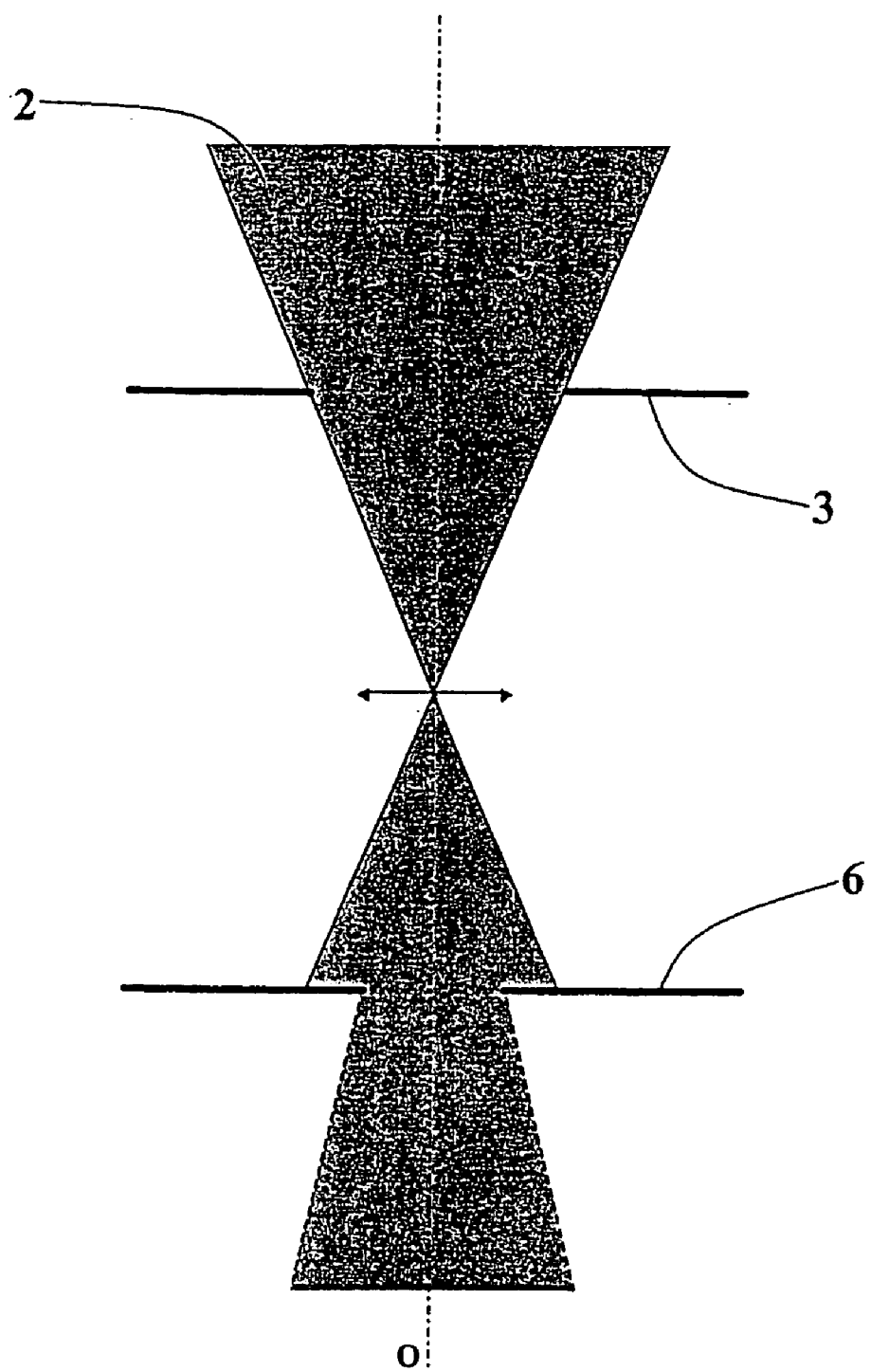
Figure 4B:
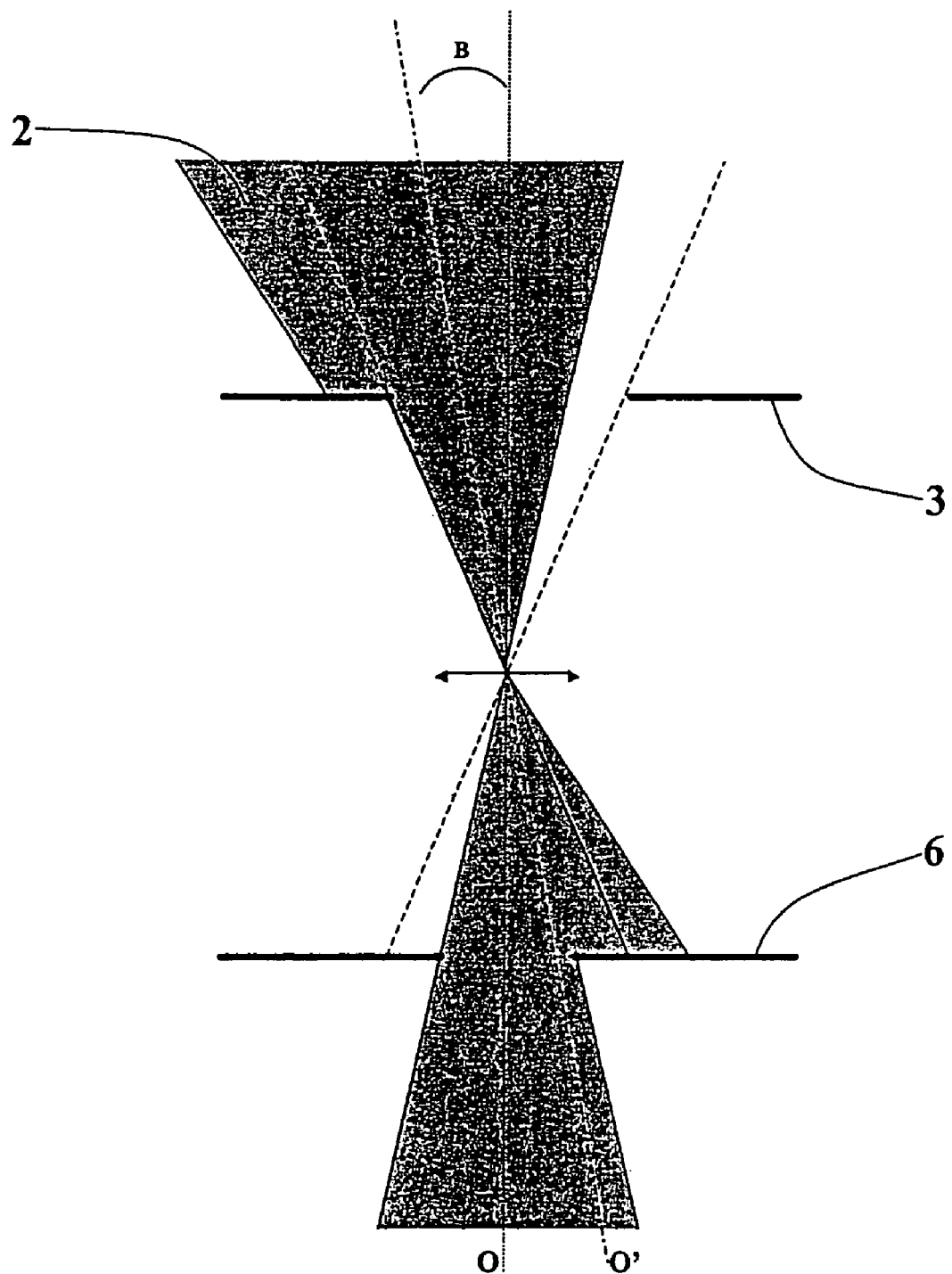
Figure 4C:
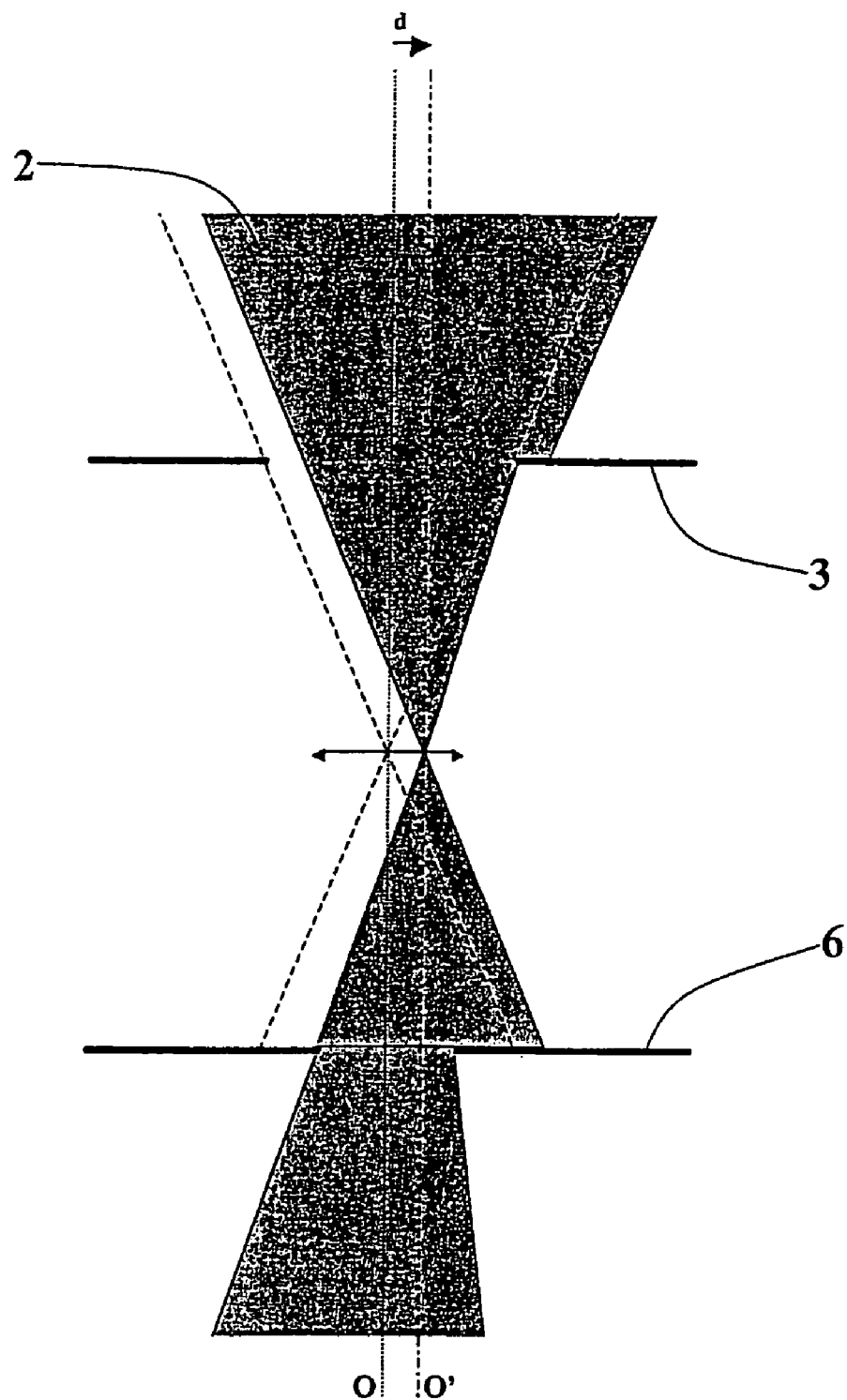
Figure 5:
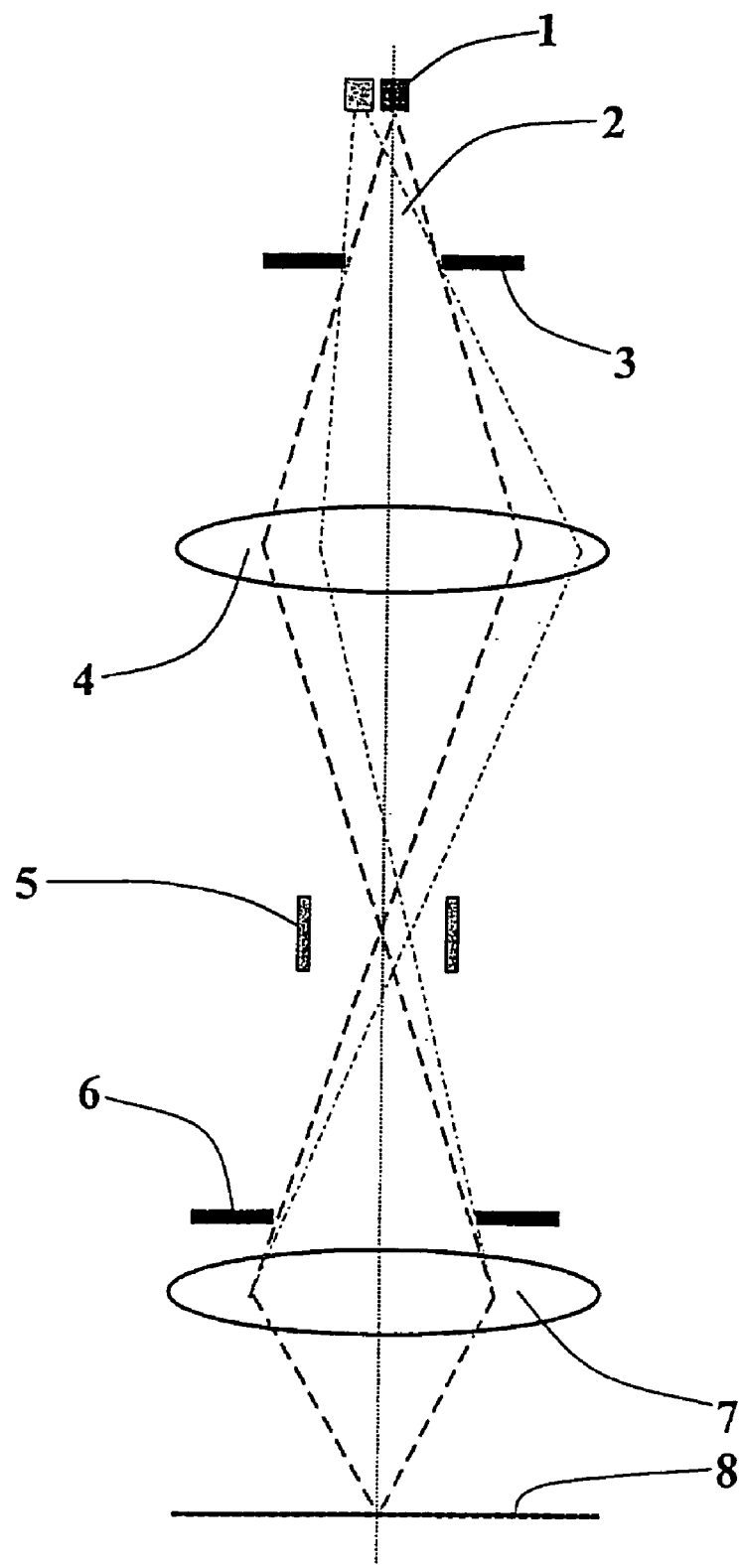
Figure 6:
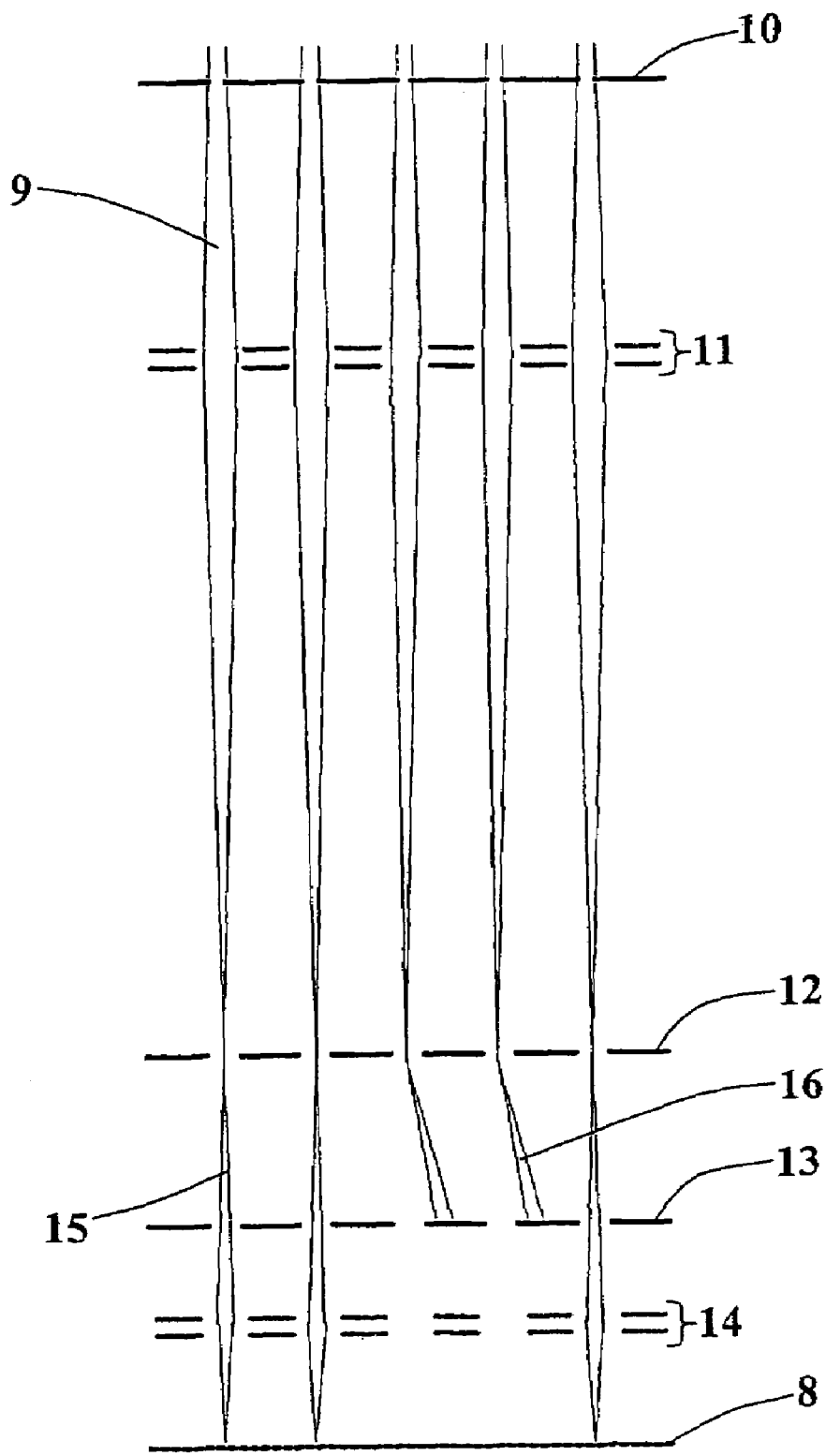
Figure 7:
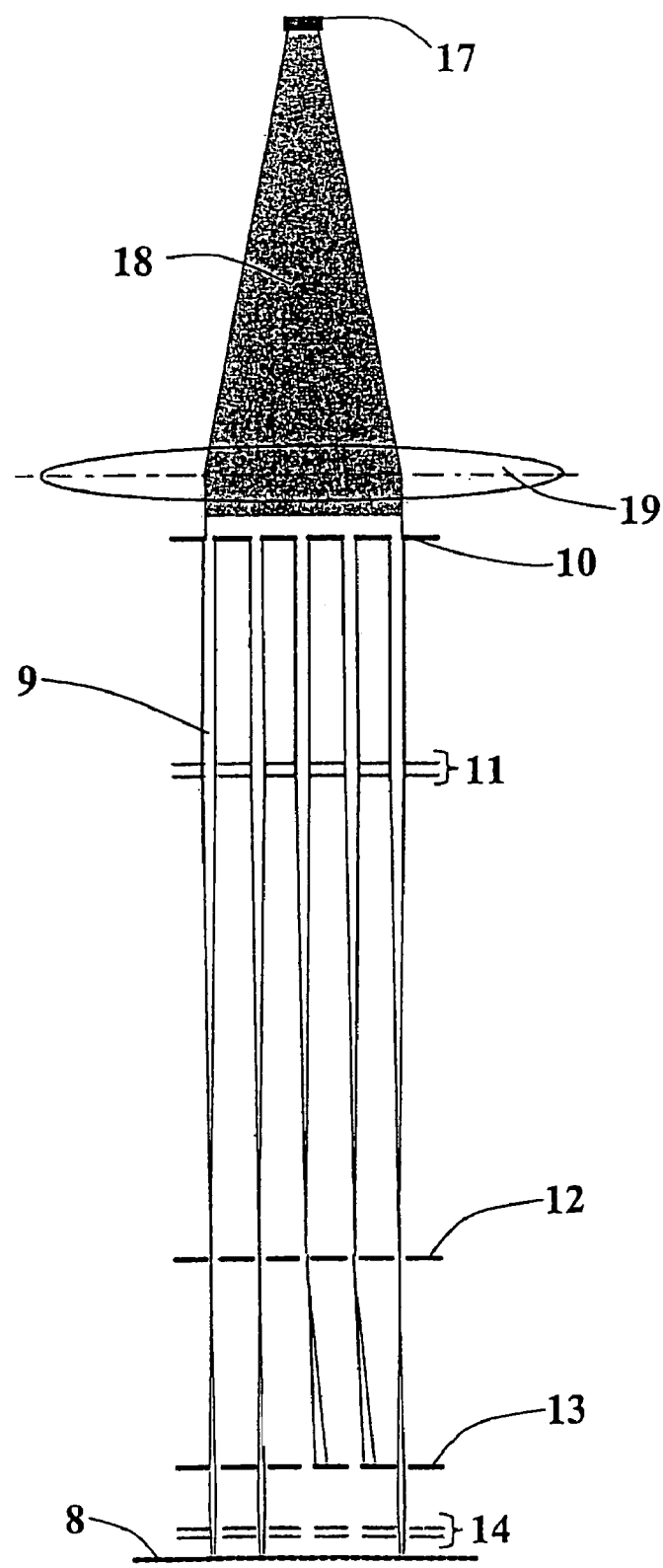
Figure 8:
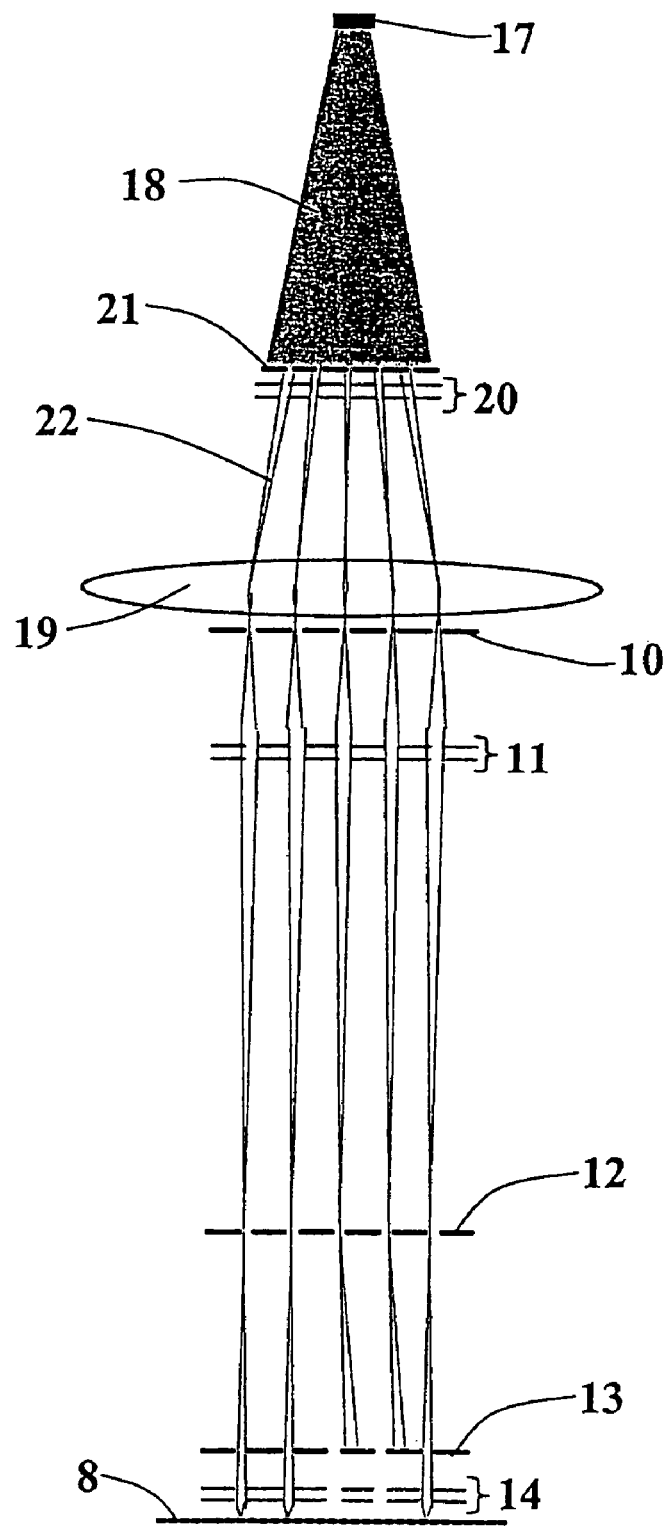
Figure 9:
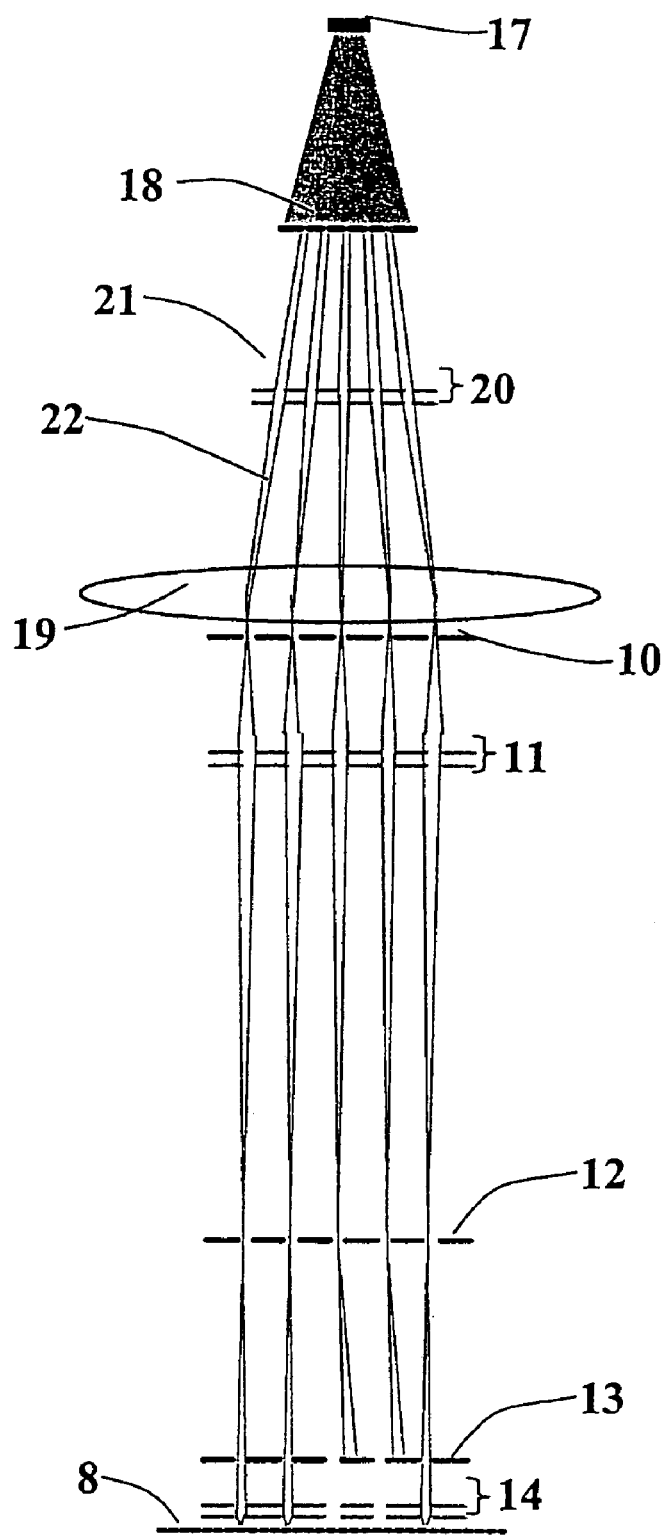

FIG. 2 shows a cross-section of a multi-beamlet charged particle optical system, FIGS. 3a–3d explain the problems, FIGS. 4a–4c explain further problem, FIG. 5 shows a first embodiment of a charged particle optical system for a single beam system according to the present invention, FIG. 6 shows a first embodiment of a charged particle optical system for a multibeam system according to the present invention, FIG. 7 shows a second embodiment of a charged particle optical system for a multibeam system according to the present invention, FIG. 8 shows a third embodiment of a charged particle optical system for a multi particle beam system according to the present invention, and FIG. 9 yet another embodiment of the system.

DETAILED DESCRIPTION OF THE INVENTION

FIG. 1 shows cross section along the optical axis of a charged particle beam exposure apparatus comprising a charged particle source, two apertures, two lenses and one electrostatic deflector. The FIG. 1A shows a top-view of FIG. 1

The source 1 emits a diverging charged particle beam 2. The first aperture 3, being substantially round, limits the opening angle of the beam impinging on the first lens 4. Additionally it takes heat away from the system, thereby enhancing the performance of the first lens 4. Said lens 4 focuses the beam substantially on the plane of the electrostatic deflector 5. Upon the reception of control signals, the deflector 5 deflects the passing charged particle beam. The second aperture 6, being substantially round, can have several purposes. First of all it may limit the opening angle of the beam falling on the second lens 7. Secondly it blocks the beam when deflected by the electrostatic deflector 5. When the beam is transmitted through the second aperture 6 the second lens 7 focuses it on an image plane 8.

FIG. 2 shows the same principle of operation for a multi-beam system. A plurality of beamlets 9 passes consecutively a first aperture array 10, a first lens array 11, a deflector array 12, a second aperture array 13 that serves as beamlet stop array and a second lens array 14, which again focuses the transmitted beamlets 15 on an image plane 8. Instead of lens arrays also single lenses, arranged in one plane, can be used. The function of all these components is comparable with the equivalents in FIG. 1. The beamlets 9 may be created with a plurality of charged particle sources or by splitting a collimated charged particle beam emitted by a single charged particle source, for instance by means of an aperture plate.

The concept depicted in FIGS. 1 and 2 is widely used, but it has a major disadvantage that especially becomes important when operating at high deflection frequencies. Considering the single beam system, the spot on the second aperture 6 is not sharply defined. Its intensity fades away. As a result the deflection angle needed to block the beamlets 16 completely is not well defined. Consequently a large deflection angle is needed to ensure the blocking operation. However, at high deflection frequencies a small deflection angle is desired.

Additional problems arise in practice when the intermediate image created in the plane of the electrostatic deflector 5 is not positioned correctly.

FIG. 3a shows an example of a correctly positioned deflector. The beamlet fills the area of both apertures.

In FIG. 3b, the effect of a having a slightly rotated angel A is demonstrated. In this case, a part of beamlet 2 is blocked by the first aperture 3. Therefore, aperture 6 is not completely filled, leading to dose variations.

In FIG. 3c, the area of the first aperture 3 is enlarged in an attempt to overcome the problem of FIG. 3b, and making the optical system less prone to variations in the angle of the incoming beamlet 2. In this case, however, beamlet 2 is partly blocked by the second aperture 6. This solution therefore does not solve the problem.

In FIG. 3d, the effect of a small shift in the optical axis o from o–>o' is demonstrated. A known solution is to increase the area for the first aperture. From FIG. 3d, however, it is clear that this does not solve the problem. Second aperture 6 still blocks part of the beamlet 2.

In FIG. 4a, in an attempt to make the system more stable, the opening angle of beamlet 2 is enlarged and the first aperture 3 is enlarged. In this situation, the heat load on the second aperture 6 increases as this aperture now blocks part of the beamlet 2. Furthermore, to remove beamlet 2 completely from the aperture, thus blanking the beamlet using aperture plate 6, requires a lager deflection angle, thus requiring a stronger electrostatic field. This makes the deflector more complex. Furthermore, it makes the deflector slower.

FIG. 4b shows the effect of the a slight rotation or the optical axis of beamlet 2 on the optical configuration of FIG. 4a: the heatload increases considerable.

FIG. 4c shows the effect of a shift in the optical axis of beamlet 2 from o to position o': again, the heat load on the second aperture increases. The heatload on the first aperture 3 also increases. Furthermore, the position of a beamlet on image plane 8 varies with the position of the optical axis of the beamlet, and with the angle of the optical axis of the beamlet.

As a result of the position variations the current passing through the apertures is different for each individual aperture. Consequently the current arriving at the image plane 8 varies per charged particle beamlet 15. When a surface to be exposed, for instance a semiconductor wafer or a photo mask, is positioned in said image plane 8, the current variations result in dose variations i.e. variations in the number of charged particles per unit area. Due to these dose variations the critical dimension control of a pattern with high-resolution features is no longer possible. A method to reduce the negative influences of position variations is to enlarge the opening angle falling on the apertures as is shown in FIG. 4b and 4c. Although part of the current is "thrown away" each individual aperture now transmits a similar area of an individual charged particle beamlet.

An additional problem caused by position variations of the beam spot at the apertures is the following. Since the source is not a singularity but has a finite size, the current distribution within each beamlet is not homogeneous. At the periphery of the beamlet the current density becomes smaller. So the solution demonstrated in FIG. 4a does not completely solve the problems. Consequently the opening angle should be enlarged even further than before, such that the transmitted part of the beamlet only comprises a part of the centre region with a homogeneous current density. In this way the non-homogeneity effect is compensated for.

A simple enlargement of the opening angle has a major disadvantage though. The lens filling of the lens following the aperture with a larger opening angle increases. Consequently the performance of the lens deteriorates. It is the purpose of the present invention to provide a electron optical system wherein the maximum opening angle needed to avoid aforementioned problems with position variations is minimised. Additionally the present invention enables the use of a small deflection angle to block a passing beam or beamlet upon the registration of a control signal.

FIGS. 5 and 6 show a first embodiment of the present invention for a single beam and a multibeam electron optical system respectively. In FIG. 5 the first aperture 3 is placed in the conjugate plane of the second aperture 6. As a result the required opening angle determined by the first aperture 3 to minimise the influence of position variations is smaller than before. The filling of the first lens 4 is therefore reduced, which enhances its performance i.e. less aberrations are introduced. Moreover the spot on the second aperture 6 is sharp, which results in a well-defined deflection angle of the electrostatic deflector 5 to accomplish blocking of the passing charged particle beam. If the heat load on the first aperture 3 becomes too large, several apertures elements are arranged in a serial order along the path of the charged particle beam. The aperture elements are then mutually aligned and preferably arranged in a serial order with decreasing diameter along the electron optical path. In this case the beam-limiting aperture element is then imaged on the second aperture 6. When the second aperture 6 also comprises a series of aperture elements, preferably with decreasing diameter along the electron optical path, the beam limiting aperture element of the first aperture 3 is projected on the beam limiting aperture element of the second aperture 6 by the first lens 4. In a similar fashion the first embodiment of the present invention is implemented in the multibeam system as depicted in FIG. 6.

The second embodiment of the present invention is only applicable for multibeam systems, especially the systems comprising a single source. FIG. 7 shows such a single source multibeam electron optical system incorporated with the first embodiment of the present invention. A charged particle source 17 emits a diverging beam 18, which is collimated by a collimator lens 19 before reaching the first aperture array 10. The first aperture array 10 then splits the beam into a plurality of beamlets. The rest of the operation is similar to the operation of the system described with respect to FIG. 6. The collimator lens 19 introduces additional aberrations in the system.

To reduce these aberrations the system can be adapted as shown in FIG. 8. Details of this approach are disclosed in PCT/NL2004/000174 by this applicant, said document referenced as if fully set forth. In this configuration an additional lens array 20 is positioned between said collimator lens 19 and said charged particle source 17. To avoid significant heating of the additional lens array 20, thereby degrading its performance, a third aperture array 21 is placed between the lens array 20 and the source 17. Now the aperture array 21 splits the emitted charged particle beam 18 in a plurality of beamlets 22 and additionally takes care of the large heat load.

FIG. 9 shows the first embodiment of the present invention applied in the system depicted in FIG. 8. Following the same reasoning as with the first embodiment regarding position variations, the position of the third aperture array 21 should be positioned in the conjugate plane of the first aperture array 10. The lens fillings of all lens arrays 11, 14, 20 are minimised, while the opening angles are large enough to deal with the position variations. Furthermore the spot on the beamlet stop array 13 remains sharp, which leads to the capability to deflect with a high frequency due to the small minimum deflection angle.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

We claim:

1. A charged-particle-optical system for a charged particle beam exposure apparatus, said system comprising:
   a first aperture means comprising at least a first substantially round aperture for partially shielding an emitted charged particle beam for forming at least one charged particle beamlet;
   a lens system comprising at least one lens for focussing said charged particle beamlet or beamlets, originating from said first aperture, within or in the vicinity of an image focal plane of said lens;
   a deflector means, substantially located in said image focal plane, comprising at least one beamlet deflector for the deflection of said charged particle beamlet or beamlets passing said deflector upon the reception of a control signal, and
   a second aperture means comprising at least one second substantially round aperture positioned in the conjugate plane of the first aperture, and said second aperture being aligned with said first aperture and said beamlet deflector for blocking said charged particle beamlet or beamlets upon deflection by said beamlet deflector and to transmit it otherwise.

2. The system according to claim 1, wherein said lens comprises an electrostatic lens.

3. The system according to claim 1, wherein said beamlet deflector comprises an electrostatic deflector.

4. The system according to claim 3, wherein said electrostatic deflector comprises at least two deflection electrodes.

5. The system according to claim 1, further comprising a second lens system arranged before said first aperture means and comprising a plurality of lenses forming an array of lenses, said lenses arranged for converging said beamlets.

6. The system according to claim 5, further comprising a third lens system arranged before said first aperture means and comprising a plurality of lenses, arranged to project images of a source of a charged particle beam exposure apparatus in the principal plane of said second lens system, the charged particle optical system further comprising a third aperture array wherein the second lens array is arranged to project images of said third aperture array on said first aperture array.

7. The system according to claim 1 for a charged particle beam exposure apparatus using a plurality of charged particle beamlets, wherein said first aperture means comprises a plurality of said first apertures forming an aperture array with one aperture for each beamlet, said lens system comprises a plurality of said lenses forming an array of lenses, each lens positioned to focus one of the plurality of charged particle beamlets from said first aperture means, said second aperture means comprises a plurality of said second apertures forming an aperture array, said deflector means comprising a plurality of said beamlet deflectors, each beamlet deflector positioned for the deflection of a passing charged particle beamlet upon receiving a control signal corresponding to the desired pattern to be exposed.

8. The system according to claim 7, wherein said lenses comprise electrostatic lenses.

9. The system according to claim 7, wherein said beamlet deflectors comprise electrostatic deflectors.

10. The system according to claim 9, wherein said electrostatic deflector comprises at least two deflection electrodes.

11. The system according to claim 7, further comprising a second lens system arranged before said first aperture means, arranged for converging said beamlets.

12. The system according to claim 11, further comprising a third lens system arranged before said first aperture means and comprising a plurality of lenses, arranged to project images of a source of a charged particle beam exposure apparatus in the principal plane of said second lens system, the charged particle optical system further comprising a third aperture array wherein the second lens array is arranged to project images of said third aperture array on said first aperture array.

13. A method of exposing a pattern on a target exposure surface using the system of claim 1.

14. The system of claim 1, wherein said charged particle beam is an electron beam.

15. The system of claim 1, wherein said charged particle beam is an ion beam.

16. A substrate processed with the charged particle beam lithography system of claim 15.

17. A charged particle exposure apparatus for exposing a substrate to a plurality of charged particle beamlets, comprising a first aperture array comprising a plurality of first apertures, one aperture for each charged particle beamlet, a lens system comprising a plurality of lenses forming an array of lenses, said lenses aligned with said first apertures, and a second aperture array comprising a plurality of substantially round second apertures aligned with said first apertures, and positioned in the conjugate plane of the first apertures, wherein said lens system is arranged between said first aperture array and said seconds aperture array for imaging said first aperture array on said second aperture array.

18. The apparatus of claim 17, comprising at least one further aperture array and at least one further lens array, wherein between each aperture array a lens array is positioned, arranged for imaging a previous aperture array on a subsequent aperture array.

19. A charged particle exposure apparatus for exposing a substrate to at least one charged particle beamlet, comprising a substantially round first aperture for blocking part of said charged particle beamlet, a lens system comprising at least one lens, said lens system aligned with said first aperture, a substantially round second aperture aligned with said first apertures, and positioned in the conjugate plane of the first aperture, and deflection means comprising at least one beamlet deflector for deflecting said beamlet when passing said deflector upon reception of a control signal, said lens system arranged between said first aperture and said second aperture for projecting an image of said first aperture on said second aperture, and said deflector substantially located in an image focal plane of said lens system.

20. A method of exposing a pattern on a target exposure surface using the apparatus of claim 17 or 19.

21. A substrate processed using a charged-particle-optical system for a charged particle beam exposure apparatus, said system comprising:
- a first aperture means comprising at least a first substantially round aperture for partially shielding an emitted charged particle beam for forming a charged particle beamlet;
- a lens system comprising at least one lens for focussing said charged particle beamlet, originating from said first aperture, within or in the vicinity of an image focal plane of said lens;
- a deflector means, substantially located in said image focal plane, comprising at least one beamlet deflector for the deflection of said charged particle beamlet passing said deflector upon the reception of a control signal, and
- a second aperture means comprising at least one second substantially round aperture positioned in the conjugate plane of the first aperture, and said second aperture being aligned with said first aperture and said beamlet deflector for blocking said charged particle beamlet upon deflection by said beamlet deflector and to transmit it otherwise.

22. A charged particle beam lithography system comprising a charged-particle-optical system for a charged particle beam exposure apparatus, said system comprising:
- a first aperture means comprising at least a first substantially round aperture for partially shielding an emitted charged particle beam for forming a charged particle beamlet;
- a lens system comprising at least one lens for focussing said charged particle beamlet, originating from said first aperture, within or in the vicinity of an image focal plane of said lens;
- a deflector means, substantially located in said image focal plane, comprising at least one beamlet deflector for the deflection of said charged particle beamlet passing said deflector upon the reception of a control signal, and
- a second aperture means comprising at least one second substantially round aperture positioned in the conjugate plane of the first aperture, and said second aperture being aligned with said first aperture and said beamlet deflector for blocking said charged particle beamlet upon deflection by said beamlet deflector and to transmit it otherwise.

23. A charged particle beam microscopy system comprising a charged-particle-optical system for a charged particle beam exposure apparatus, said system comprising:
- a first aperture means comprising at least a first substantially round aperture for partially shielding an emitted charged particle beam for forming a charged particle beamlet;
- a lens system comprising at least one lens for focussing said charged particle beamlet, originating from said first aperture, within or in the vicinity of an image focal plane of said lens;
- a deflector means, substantially located in said image focal plane, comprising at least one beamlet deflector for the deflection of said charged particle beamlet passing said deflector upon the reception of a control signal, and
- a second aperture means comprising at least one second substantially round aperture positioned in the conjugate plane of the first aperture, and said second aperture being aligned with said first aperture and said beamlet deflector for blocking said charged particle beamlet upon deflection by said beamlet deflector and to transmit it otherwise.

* * * * *